US012764903B2

(12) United States Patent
Shi et al.

(10) Patent No.: US 12,764,903 B2
(45) Date of Patent: Oct. 13, 2026

(54) LIQUID-ASSISTED AND THERMOELECTRIC-BASED TEMPERATURE CONTROL FOR SERVERS AND OTHER ELECTRONIC EQUIPMENT

(71) Applicant: Dell Products L.P., Round Rock, TX (US)

(72) Inventors: Zhuoya Shi, Beijing (CN); Xin Zhi Ma, Shanghai (CN)

(73) Assignee: Dell Products L.P., Round Rock, TX (US)

(*) Notice: Subject to any disclaimer, the term of this patent is extended or adjusted under 35 U.S.C. 154(b) by 239 days.

(21) Appl. No.: 18/665,717

(22) Filed: May 16, 2024

(65) Prior Publication Data

US 2025/0341874 A1 Nov. 6, 2025

(30) Foreign Application Priority Data

May 6, 2024 (CN) ......................... 202410550839.6

(51) Int. Cl.
*H05K 7/20* (2006.01)
*G06F 1/20* (2006.01)

(52) U.S. Cl.
CPC ......... *H05K 7/20272* (2013.01); *G06F 1/206* (2013.01); *H05K 7/20727* (2013.01); *G06F 2200/201* (2013.01)

(58) Field of Classification Search
None
See application file for complete search history.

(56) References Cited

U.S. PATENT DOCUMENTS

2006/0225441 A1* 10/2006 Goenka .................... F25B 21/04 62/115
2013/0228313 A1* 9/2013 Fried .................... F28D 15/0266 165/104.26

(Continued)

OTHER PUBLICATIONS

P. Artman et al., “Advanced Thermal Control: Optimizing across Environments and Power Goals,” Feb. 2012, 10 pages.

(Continued)

*Primary Examiner* — Courtney L Smith
(74) *Attorney, Agent, or Firm* — Ryan, Mason & Lewis, LLP

(57) ABSTRACT

An apparatus in one embodiment comprises an electronic equipment chassis having electronic equipment installed therein, a thermoelectric module arranged adjacent a front portion of the electronic equipment chassis, a heat exchanger module arranged adjacent a rear portion of the electronic equipment chassis, and at least first and second liquid-carrying conduits coupled between the thermoelectric module and the heat exchanger module and passing through at least a portion of the electronic equipment chassis. The thermoelectric module, the heat exchanger module and the liquid-carrying conduits are collectively configured to provide temperature control for one or more components of the electronic equipment. The electronic equipment installed in the electronic equipment chassis may comprise at least one server. The thermoelectric module illustratively comprises a thermoelectric cooler, a cold plate coupled to a first side of the thermoelectric cooler, and a heatsink coupled to a second side of the thermoelectric cooler, opposite the first side.

20 Claims, 5 Drawing Sheets

(56) References Cited

U.S. PATENT DOCUMENTS

| | | | | |
|---|---|---|---|---|
| 2014/0213167 A1* | 7/2014 | Goenka | B60H 1/00028 | 454/159 |
| 2017/0013746 A1* | 1/2017 | Campbell | H05K 7/20736 | |
| 2022/0214730 A1* | 7/2022 | Navarro Alvarez | G06F 1/206 | |
| 2023/0112559 A1* | 4/2023 | Gao | H05K 7/20272 | 62/3.2 |

OTHER PUBLICATIONS

H. Shabbir et al., "Thermal Manage" Features and Benefits, Feb. 2020, 4 pages.

Wikipedia, "Thermoelectric Cooling," https://en.wikipedia.org/wiki/Thermoelectric_cooling, Mar. 11, 2024, 8 pages.

* cited by examiner

LIQUID-ASSISTED AND THERMOELECTRIC-BASED TEMPERATURE CONTROL FOR SERVERS AND OTHER ELECTRONIC EQUIPMENT

RELATED APPLICATION

The present application claims priority to Chinese Patent Application No. 202410550839.6, filed May 6, 2024, and entitled "Liquid-Assisted and Thermoelectric-Based Temperature Control for Servers and Other Electronic Equipment," which is incorporated by reference herein in its entirety.

FIELD

The field relates generally to electronic equipment, and more particularly to temperature control arrangements for such electronic equipment.

BACKGROUND

A given set of electronic equipment configured to provide desired system functionality is often installed in a chassis. Such equipment can include, for example, various arrangements of processors such as central processing units (CPUs) and/or graphics processing units (GPUs), memory modules, circuit boards, storage devices, interface cards and power supplies used to implement at least a portion of a server system, a storage system or other type of information processing system.

The chassis typically complies with established standards of height, width and depth to facilitate mounting of the chassis in an equipment cabinet or other type of electronic equipment rack. For example, standard chassis heights such as 1 U, 2 U, 3 U, 4 U and so on are commonly used, where U denotes a unit height of 1.75 inches (1.75") in accordance with the well-known EIA-310-D industry standard.

Temperature control of electronic equipment installed in an electronic equipment chassis is an increasingly important issue, for example, as the number and power consumption of CPUs, GPUs and/or other related components continues to increase. Unfortunately, conventional approaches can require significant increases in the size of an equipment chassis, such as requiring an increase in chassis height from 1 U to 2 U, in order to accommodate various types of temperature control components. Moreover, such approaches often have difficulty in providing adequate temperature control for edge computing equipment that, due to its typical installation location outside of the data center context, can be subject to substantial external temperature variations. Accordingly, a need exists for improved temperature control for servers, edge computing equipment and other types of electronic equipment.

SUMMARY

Illustrative embodiments of the present disclosure provide techniques for liquid-assisted and thermoelectric-based temperature control of electronic equipment in an electronic equipment chassis. These and other arrangements disclosed herein can provide enhanced temperature control for a wide variety of different types of electronic equipment without requiring a significant increase in equipment size.

For example, in some embodiments, liquid-assisted and thermoelectric-based temperature control of one or more components of at least one server or other type of electronic equipment arranged in a chassis is implemented utilizing a single air channel. These and other embodiments can advantageously avoid the need to increase equipment chassis size for servers, such as from a 1 U chassis height to a 2 U chassis height, when implementing liquid-assisted and thermoelectric-based temperature control as disclosed herein.

In addition, some embodiments are configured to provide temperature control with both cooling and heating modes of operation utilizing a single thermoelectric module and an associated heat exchanger module, so as to accommodate the potentially wide external temperature variations of edge computing equipment and other types of electronic equipment.

In one embodiment, an apparatus comprises an electronic equipment chassis having electronic equipment installed therein, a thermoelectric module arranged adjacent a front portion of the electronic equipment chassis, a heat exchanger module arranged adjacent a rear portion of the electronic equipment chassis, and at least first and second liquid-carrying conduits coupled between the thermoelectric module and the heat exchanger module and passing through at least a portion of the electronic equipment chassis. The thermoelectric module, the heat exchanger module and the liquid-carrying conduits are collectively configured to provide temperature control for one or more components of the electronic equipment.

The electronic equipment installed in the electronic equipment chassis illustratively comprises at least one server, although a wide variety of other types of electronic equipment can additionally or alternatively be used in other embodiments.

The thermoelectric module in some embodiments illustratively comprises a thermoelectric cooler, a cold plate coupled to a first side of the thermoelectric cooler, and a heatsink coupled to a second side of the thermoelectric cooler, opposite the first side.

The thermoelectric module may be, for example, coupled to an exterior surface of the front portion of the electronic equipment chassis, or coupled to a front portion of an electronic equipment rack in which the electronic equipment chassis is installed. In other embodiments, the thermoelectric module can be implemented at least in part within the electronic equipment chassis.

The heat exchanger module in some embodiments illustratively comprises a heat exchanger and a pump, with the pump being configured to circulate liquid through the thermoelectric module, the heat exchanger and the liquid-carrying conduits.

The heat exchanger module may be, for example, coupled to an exterior surface of the rear portion of the electronic equipment chassis, or coupled to a rear portion of an electronic equipment rack in which the electronic equipment chassis is installed. In other embodiments, the heat exchanger module can be implemented at least in part within the electronic equipment chassis.

In some embodiments, each of the liquid-carrying conduits is connected at a first end thereof to a cold plate of the thermoelectric module and at a second end thereof to the heat exchanger module.

In an example cooling mode of operation, a control current is applied to a thermoelectric cooler of the thermoelectric module to configure a first side of the thermoelectric cooler adjacent the cold plate of the thermoelectric module as a hot side of the thermoelectric cooler, and to configure a second side of the thermoelectric cooler adjacent a heatsink of the thermoelectric module as a cold side of the thermoelectric cooler, with the heat exchanger module moving hot water from the hot side of the thermoelectric cooler via the cold plate and the first liquid-carrying conduit into the heat exchanger module, and moving cool water from the heat exchanger module back to the hot side of the thermoelectric cooler via the second liquid-carrying conduit and the cold plate. Cool air generated from the cold side of the thermoelectric cooler is illustratively pulled from the front portion of the electronic equipment chassis to the rear portion of the electronic equipment chassis to cool the one or more components of the electronic equipment.

In an example heating mode of operation, a control current is applied to a thermoelectric cooler of the thermoelectric module to configure a first side of the thermoelectric cooler adjacent the cold plate of the thermoelectric module as a cold side of the thermoelectric cooler, and to configure a second side of the thermoelectric cooler adjacent a heatsink of the thermoelectric cooler as a hot side of the thermoelectric cooler, with the heat exchanger module moving cool water from the cold side of the thermoelectric cooler via the cold plate and the first liquid-carrying conduit into the heat exchanger module, and moving hot water from the heat exchanger module back to the cold side of the thermoelectric cooler via the second liquid-carrying conduit and the cold plate. Warm air generated from the hot side of the thermoelectric cooler is illustratively pulled from the front portion of the electronic equipment chassis to the rear portion of the electronic equipment chassis to heat the one or more components of the electronic equipment.

In an example additional mode of operation, an amount of control current applied to a thermoelectric cooler of the thermoelectric module is illustratively adjusted such that neither the first side of the thermoelectric cooler adjacent the cold plate nor the second side of the thermoelectric cooler adjacent the heat sink is configured as a cold side or a hot side, and neither cooling nor heating is provided.

These and other illustrative embodiments include, without limitation, methods, apparatus, networks, systems and processor-readable storage media.

DETAILED DESCRIPTION

Figure 1:
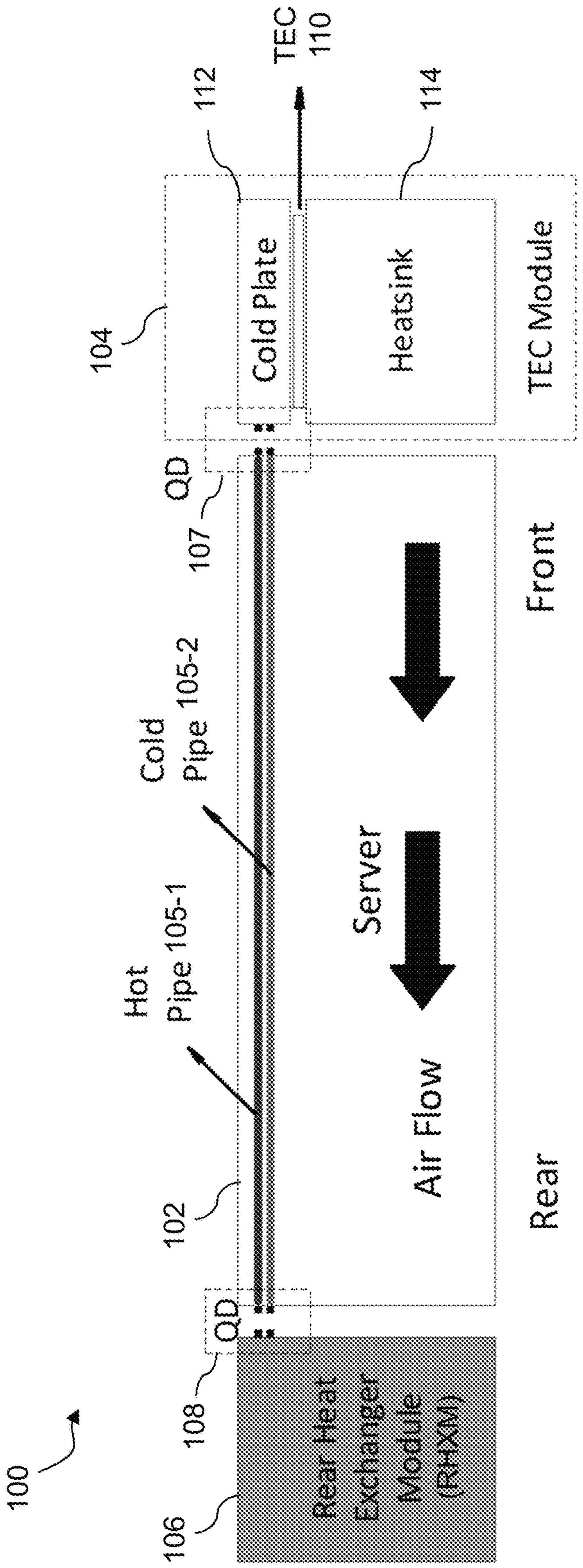
FIG. 1 is a side view of an electronic equipment apparatus with liquid-assisted and thermoelectric-based temperature control for a server in an illustrative embodiment.

Illustrative embodiments will be described herein with reference to exemplary chassis configurations for electronic equipment such as servers, storage systems, etc. It is to be appreciated, however, that embodiments of the invention are not restricted to the particular illustrative configurations shown. Accordingly, terms such as "electronic equipment chassis" as used herein are intended to be broadly construed, so as to encompass, for example, a wide variety of other arrangements of other types of computing devices or other electronic equipment, possibly arranged with other types of electrical equipment in a common housing of an electronic equipment chassis.

Information technology (IT) equipment, such as various compute, network and storage hardware or other electronic equipment, is typically installed in an electronic equipment chassis. The electronic equipment chassis may form part of an electronic equipment cabinet (e.g., a computer cabinet) or other electronic equipment rack (e.g., a computer or server rack, also referred to herein simply as a "rack") that is installed in a data center, computer room or other facility. Equipment cabinets or other types of electronic equipment racks provide or have physical electronic equipment chassis that can house multiple pieces of equipment, such as multiple computing devices (e.g., servers, storage systems, network devices, etc.). As noted above, an electronic equipment chassis typically complies with established standards of height, width and depth to facilitate mounting of electronic equipment in an equipment cabinet or other type of electronic equipment rack. For example, standard chassis heights such as 1 U, 2 U, 3 U, 4 U and so on are commonly used, where U denotes a unit height of 1.75" in accordance with the well-known EIA-310-D industry standard.

With continued IT modernization, data centers and other types of information processing systems provide support for IT assets with higher processing power, increased network bandwidth, etc. Such IT assets may include, but are not limited to, various physical computing hardware such as servers, storage systems, networking equipment, other types of processing and computing devices, etc. IT assets are examples of what is more generally referred to herein as "electronic equipment" that are installed in an electronic equipment chassis that forms or provides part of an electronic equipment rack.

To support such higher processing power and increased network bandwidth, among other features, electronic equipment faces many thermal challenges. Cooling requirements for the electronic equipment (as well as the electronic equipment chassis housing such electronic equipment, and the data center or other facility in which the electronic equipment chassis is placed) are becoming more vital. Various types of cooling methods may be utilized, including air cooling, liquid cooling, and liquid immersion cooling. Most if not all electronic equipment in a typical data center utilizes air cooling methods by leveraging redundant, hot-swappable fans. Liquid cooling may also be employed, though at a higher cost than air cooling. Air and liquid cooling methods, however, may not be sufficient for certain use cases.

Moreover, edge computing deployments are becoming increasingly prevalent, and many edge computing environments have potentially wide environmental temperature ranges, for example, from a high ambient temperature of up to about 50° C. to about 60° C., to a low ambient temperature that could be as low as about −40° C., although it is to be appreciated that other ambient temperature ranges may be present in other electronic equipment deployments. Traditional design solutions are not specifically optimized for edge deployments and their associated environmental temperature ranges.

As technologies advance, server CPUs and/or GPUs are being designed to include larger numbers of processing cores, with a corresponding higher thermal design power (TDP), and are therefore increasingly difficult to cool with conventional air cooling.

Some existing solutions employ specialized temperature control devices, such as precision air conditioners, leading to additional costs and space requirements, and limiting the extent of possible deployments.

Other existing solutions preheat servers or other electronic equipment with a single heater under low ambient temperatures, limiting flexibility on the cooling requirements with the high ambient temperature.

Semiconductor refrigeration cooling technology is based on the principle of the thermoelectric effect. It provides a cooling method with high controllability, and that is simple to use at low cost. There are commercially-available semiconductor refrigeration cooling pads, also referred to as "semiconductor refrigerators," which may be viewed as examples of what are more generally referred to herein as thermoelectric coolers or TECs.

In conventional practice, a heatsink is attached to a hot side of the thermoelectric cooler, the cold side of the thermoelectric cooler is attached to the components to be cooled, and power is applied to the thermoelectric cooler such that it cools the components. But since its power efficiency is generally low, the heat generated by the thermoelectric cooler is completely wasted in such an arrangement.

Another solution involves building modular data centers, with air conditioning applied to the various modules of the modular data centers. It is an effective cooling method, but even a very small or "micro" modular data center needs to occupy substantial rack space, which may be an unduly large footprint for edge applications.

There are other existing solutions that require an additional air channel in order to exhaust heat. This can unduly increase the size of the server by, for example, requiring what would otherwise be a 1 U server to instead be implemented as a 2 U server.

Illustrative embodiments provide highly advantageous solutions to these and other problems of conventional approaches, as will now be described in more detail with reference to FIGS. 1 through 4.

FIG. 1 shows an illustrative embodiment of an electronic equipment apparatus 100 that implements liquid-assisted and thermoelectric-based temperature control as disclosed herein. The electronic equipment apparatus 100 comprises a server 102 having front and rear portions as shown. The electronic equipment apparatus 100 further comprises a thermoelectric cooler (TEC) module 104 arranged at the front portion of the server 102, and a rear heat exchanger module (RHXM) 106 arranged at the rear portion of the server. The large horizontal arrows in the figure show the direction of air flow from the front portion of the server 102 to the rear portion of the server 102.

The server 102 is assumed to be deployed in the form of an electronic equipment chassis and includes liquid-carrying pipes 105-1 and 105-2, illustratively denoted as respective "hot" and "cold" pipes, although these designations vary depending on whether the apparatus is in a cooling mode or a heating mode, as will be described in more detail elsewhere herein.

The liquid-carrying pipes 105-1 and 105-2, collectively referred to herein as liquid-carrying pipes 105, are coupled via corresponding quick disconnect (QD) interfaces 107 and 108 at the respective front and rear portions of the server 102 to the respective TEC module 104 and RHXM 106. The QD interfaces 107 and 108 are only examples, and other types of connectors and interfaces can be used in other embodiments.

The TEC module 104 more particularly comprises a TEC 110 arranged between a cold plate 112 and a heatsink 114. The TEC 110 has two primary sides, illustratively a "cold" side and a "hot" side respectively, with a first one of the sides of the TEC 110 being coupled to a cold plate 112 and a second opposing side of the TEC 110 being coupled to the heatsink 114. The TEC 110 is illustratively implemented as a current-controlled solid-state active heat pump device that utilizes the Peltier effect to transfer heat from one side of the heat pump device to the other, depending on the direction of the current applied to the TEC 110. Other types and arrangements of TEC components can be used in other embodiments.

The RHXM 106 illustratively comprises a heat exchanger and a pump, which are not explicitly shown in the figure, although again other arrangements are possible. For example, another type of "heat exchanger module" as that term is broadly used herein can comprise at least one of multiple pumps and multiple heat exchangers.

The liquid-carrying pipes 105 are illustratively coupled at the front portion of the server 102 to the cold plate 112 of the TEC module 104 via the QD interface 107 and are similarly coupled at the rear portion of the server 102 to the RHXM 106 via the QD interface 108. Other types and arrangements of connectors or other interfaces can be used to couple the liquid-carrying pipes 105 between the TEC module 104 and the RHXM 106.

The liquid-carrying pipes 105 are examples of what are more generally referred to herein as "liquid-carrying conduits," and other types and arrangements of conduits can be used in other embodiments. Such conduits in illustrative embodiments carry water, although other types of fluids, including by way of example various coolants or other thermally-conductive dielectric fluids, can additionally or alternatively be used. The pump of the RHXM 106 is used to circulate the water and/or other fluids through the TEC module 104, the liquid-carrying pipes 105 and the heat exchanger of the RHXM 106.

For example, the RHXM 106 illustratively utilizes its pump to move hot water away from the TEC module 104 via the hot pipe corresponding to liquid-carrying pipe 105-1, cools the hot water in its heat exchanger, and returns cold water back to the TEC module 104 via the cold pipe corresponding to liquid-carrying pipe 105-2. It should be noted that terms such as "hot" and "cold" as used herein are intended to be broadly interpreted as being indicative of, for example, relative temperatures of the liquid carried by different ones of the liquid-carrying pipes 105, and should not be viewed as requiring any particular temperature levels. Similar terms such as "warm" and "cool" are similarly intended to indicate relative temperatures rather than any particular temperature levels, and should also be broadly construed.

The TEC module 104 may be, for example, coupled to an exterior surface of the front portion of the electronic equipment chassis of the server 102, or coupled to a front portion of an electronic equipment rack in which the electronic equipment chassis of the server 102 is installed. In other embodiments, the TEC module 104 can be implemented at least in part within the electronic equipment chassis of the server 102.

Similarly, the RHXM 106 may be, for example, coupled to an exterior surface of the rear portion of the electronic equipment chassis of the server 102, or coupled to a rear portion of an electronic equipment rack in which the electronic equipment chassis of the server 102 is installed. In other embodiments, the RHXM 106 can be implemented at least in part within the electronic equipment chassis of the server 102.

Also, although the TEC module 104 and the RHXM 106 are illustratively shown as being external to the server 102 in the figure, this is by way of illustrative example only, and in other embodiments at least one of the TEC module 104 and the RHXM 106 can be implemented at least in part within the electronic equipment chassis of the server 102.

All of the above-noted example placement arrangements of the TEC module 104 and the RHXM 106 relative to the respective front and rear portions of the server 102, including ones in which such components are at least in part deployed within an electronic equipment chassis of the server 102, are intended to be encompassed by the term "adjacent" as broadly used herein with respect to the deployment of the TEC module 104 adjacent the front portion of the server 102 and the RHXM 106 adjacent the rear portion of the server 102.

Other arrangements of the TEC module 104, the RHXM 106 and the liquid-carrying pipes 105 relative to the electronic equipment chassis of the server 102 can be used. For example, in some embodiments, the positions of the TEC module 104 and the RHXM 106 at the respective front and rear portions of the server 102 can be reversed. It is also possible that one or more such components can be deployed internally to the chassis, possibly at an intermediate portion of the chassis between the front and rear portions. These and numerous other arrangements are possible in other embodiments.

The TEC module 104, the RHXM 106 and the liquid-carrying pipes 105 are collectively configured to provide temperature control for at least a portion of the server 102. For example, in some embodiments, the TEC module 104, the RHXM 106 and the liquid-carrying pipes 105 can be configured in multiple distinct operating modes, including at least a cooling mode and a heating mode, and possibly one or more additional modes.

In an example cooling mode of operation, a control current is applied to the TEC 110 of the TEC module 104 to configure the first side of the TEC 110 adjacent the cold plate 112 of the TEC module 104 as a hot side of the TEC 110, and to configure the second side of the TEC 110 adjacent the heatsink 114 of the TEC module 104 as a cold side of the TEC 110, with the RHXM 106 moving hot water from the hot side of the TEC 110 via the cold plate 112 and the first liquid-carrying pipe 105-1 into the RHXM 106, and moving cool water from the RHXM 106 back to the hot side of the TEC 110 via the second liquid-carrying pipe 105-2 and the cold plate 112. In this mode, cool air generated from the cold side of the TEC 110 is pulled from the front portion of the server 102 to the rear portion of the server 102, in the air flow direction shown in the figure, to cool one or more components of the server 102.

The air flow in this illustrative embodiment and other embodiments disclosed herein may be established at least in part using various arrangements of one or more fans or other air-circulating mechanisms, not explicitly shown in the figure, as would be appreciated by those skilled in the art.

In an example heating mode of operation, a control current is applied to a TEC 110 of the TEC module 104 to configure the first side of the TEC 110 adjacent the cold plate 112 of the TEC module 104 as a cold side of the TEC 110, and to configure the second side of the TEC 110 adjacent the heatsink 114 of the TEC module 104 as a hot side of the TEC 110, with the RHXM 106 moving cool water from the cold side of the TEC 110 via the cold plate 112 and the first liquid-carrying pipe 105-1 into the RHXM 106, and moving hot water from the RHXM 106 back to the cold side of the TEC 110 via the second liquid-carrying pipe 105-2 and the cold plate 112. In this mode, warm air generated from the hot side of the TEC 110 is pulled from the front portion of the server 102 to the rear portion of the server 102, in the air flow direction shown in the figure, to heat one or more components of the server 102.

In an example additional mode of operation, an amount of control current applied to the TEC 110 of the TEC module 104 is illustratively adjusted (e.g., set to zero or set to a minimal amount below a switching threshold) such that neither the first side of the TEC 110 adjacent the cold plate 112 nor the second side of the TEC 110 adjacent the heatsink 114 is configured as a cold side or a hot side, and neither cooling nor heating is provided.

The above operating modes are examples only, and additional or alternative modes of operation can be provided in other embodiments. Additional details of example heating and cooling modes will now be described with reference to FIGS. 2A and 2B.

Figure 2A:
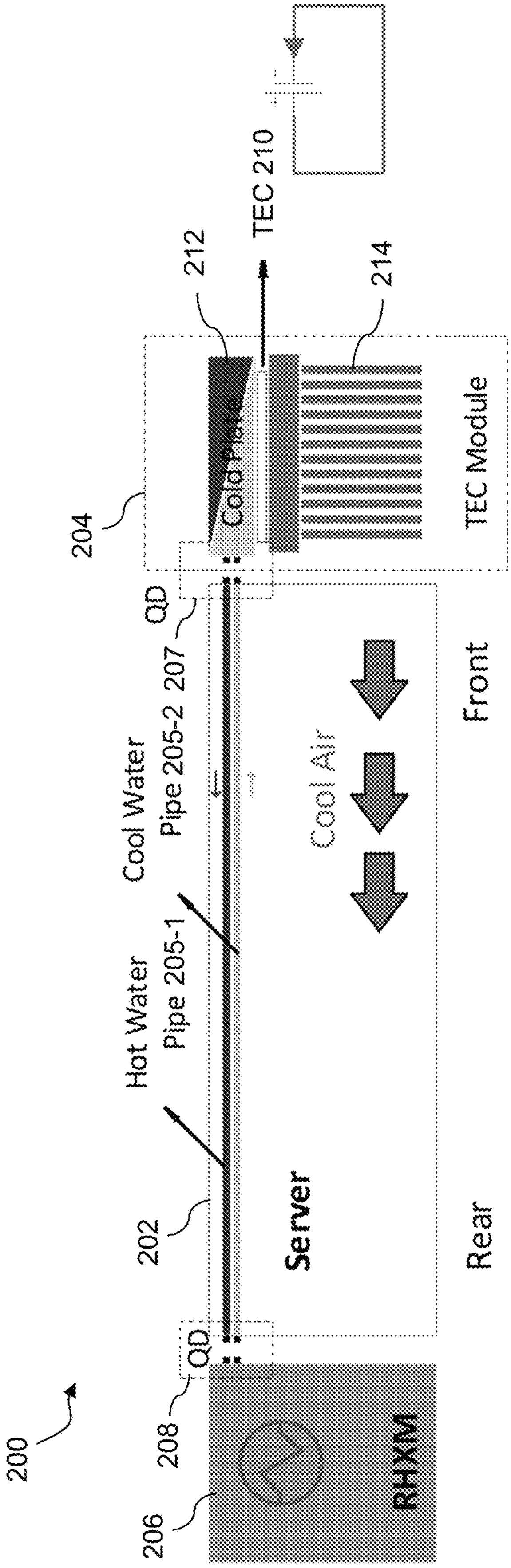
FIGS. 2A and 2B are side views showing respective cooling and heating modes of operation of an electronic equipment apparatus with liquid-assisted and thermoelectric-based temperature control for a server in an illustrative embodiment.
Figure 2B:
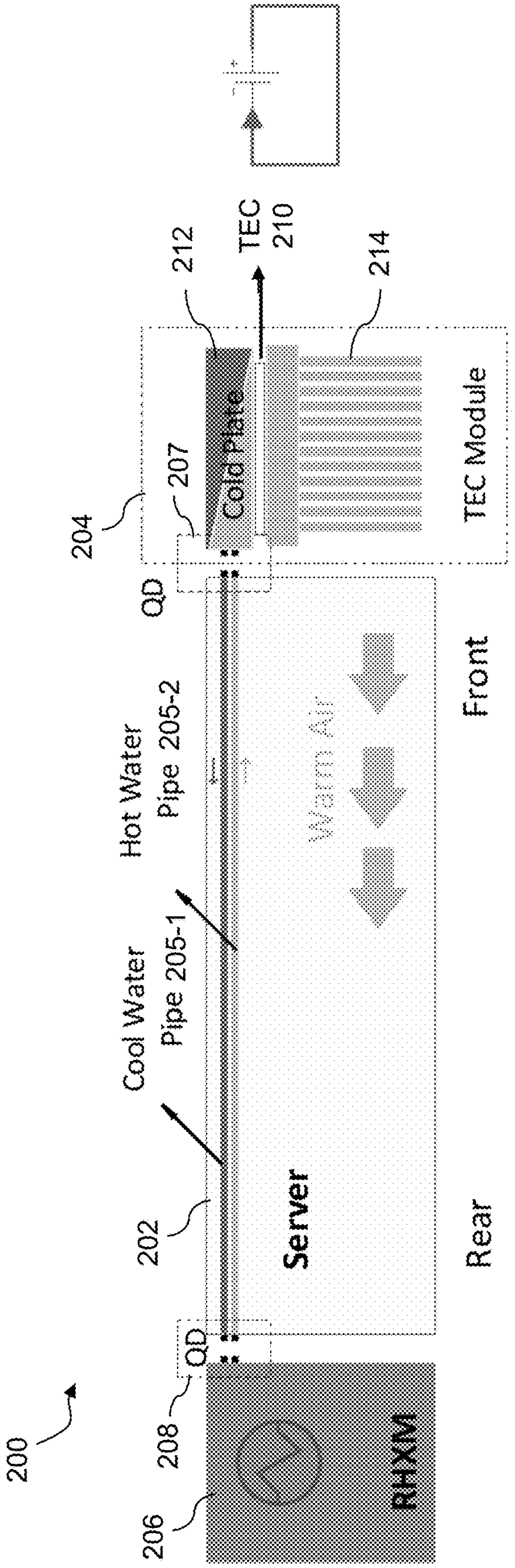

FIGS. 2A and 2B show respective cooling and heating modes of operation of an electronic equipment apparatus 200 with liquid-assisted and thermoelectric-based temperature control for a server 202 in an illustrative embodiment. The electronic equipment apparatus 200 is generally similar to the electronic equipment apparatus 100 previously described in conjunction with FIG. 1, and includes the server 202, a TEC module 204 arranged proximate a front portion of the server 202, and a RHXM 206 arranged proximate a rear portion of the server 202. The electronic equipment apparatus 200 further comprises liquid-carrying pipes 205-1 and 205-2, collectively referred to as liquid-carrying pipes 205, which are coupled via QD interfaces 207 and 208 to the respective TEC module 204 and RHXM 206 at the respective front and rear portions of the server 202. The TEC module 204 comprises a TEC 210, a cold plate 212 and a heatsink 214.

The components of electronic equipment apparatus 200 generally operate in a manner similar to that of the corresponding components previously described in conjunction with FIG. 1, but FIG. 2A more particularly illustrates a cooling mode of operation of the electronic equipment apparatus 200, and FIG. 2B more particularly illustrates a heating mode of operation of the electronic equipment apparatus 200.

Referring now to FIG. 2A, the cooling mode of operation is shown. When an ambient temperature and/or other monitored temperature is sufficiently high, for example, above a designated server upper operating temperature, the TEC module 204 and RHXM 206 are configured to operate in the cooling mode. More particularly, the control current applied to the TEC 210 is adjusted so as to make the upper side of the TEC 210, that is, the side adjacent the cold plate 212, the hot side, and to make the lower side of the TEC 210, that is, the side adjacent to the heatsink 214, the cold side. The control current direction for this configuration is illustratively shown in the small circuit diagram at the far right side of the figure. The RHXM 206 will move hot water from the hot side of the TEC 210 via the cold plate 212 and the liquid-carrying pipe 205-1, acting as a hot water pipe, into the RHXM 206, and will move cool water back to the hot side of the TEC 210 via the liquid-carrying pipe 205-2, acting as a cool water pipe, and the cold plate 212. The cold side of the TEC 210 will generate cool air, which is "inhaled" by the server 202, or in other words pulled from the front portion to the rear portion as indicated by the direction of cool air flow in the figure, and is used to cool server components.

Referring now to FIG. 2B, the heating mode of operation is shown. When an ambient temperature and/or other monitored temperature is sufficiently low, for example, below a designated server lower operating temperature, the TEC module 204 and RHXM 206 are configured to operate in the heating mode. More particularly, the control current applied to the TEC 210 is adjusted so as to make the upper side of the TEC 210, that is, the side adjacent the cold plate 212, the cold side, and to make the lower side of the TEC 210, that is, the side adjacent to the heatsink 214, the hot side. The control current direction for this configuration is illustratively shown in the small circuit diagram at the far right side of the figure, and is the opposite of the direction used in the cooling mode. The RHXM 206 will move cool water from the cold side of the TEC 210 via the cold plate 212 and the liquid-carrying pipe 205-1, acting as a cool water pipe, into the RHXM 206, and will move hot water back to the cold side of the TEC 210 via the liquid-carrying pipe 205-2, acting as a hot water pipe, and the cold plate 212, thereby preventing the liquid in the cold plate 212 and the liquid-carrying pipes 205 from freezing. The hot side of the TEC 210 will generate hot air, which is "inhaled" by the server 202, or in other words pulled from the front portion to the rear portion as indicated by the direction of warm air flow in the figure, and is used to heat server components.

When an ambient temperature and/or other monitored temperature is between the designated server upper operating temperature and the designated server lower operating temperature, the TEC module 204 and the RHXM 206 can turned off. This is illustratively a normal mode of operation in which neither cooling nor heating occurs.

It should be noted that references herein to "ambient temperature" should not be viewed as limiting in any way. For example, other embodiments can be configured to control the temperature of a server and/or other electronic equipment based on additional or alternative monitored temperatures, such as exhaust temperatures of a chassis or rack, internal equipment temperatures from sensors on one or more motherboards or other system boards of a given set of electronic equipment, internal component temperatures from one or more component thermal sensors, and/or external system temperatures from rack-side sensors or other external sensors, as well as various combinations thereof. In embodiments in which multiple distinct temperatures are monitored at different locations within a given system deployment, for example, an average or other function of the various temperatures may be compared to a threshold and used to control switching between the operating modes. As another example, the multiple monitored temperatures may be compared to respective separate thresholds, with switching between the operating modes occurring only when indicated as appropriate by all of the monitored temperatures. These and numerous other arrangements for providing temperature control as disclosed herein using one or more monitored temperatures will be apparent to those skilled in the art.

Again, other types and arrangements of operating modes can be used in other embodiments. The designated server upper operating temperature and the designated server lower operating temperature, and other upper or lower thresholds referred to herein, can be set in a straightforward manner based on particular specifics of a given implementation, such as thermal characteristics of the operating environment and the thermal requirements of the electronic equipment, as will be appreciated by those skilled in the art.

Figure 3:
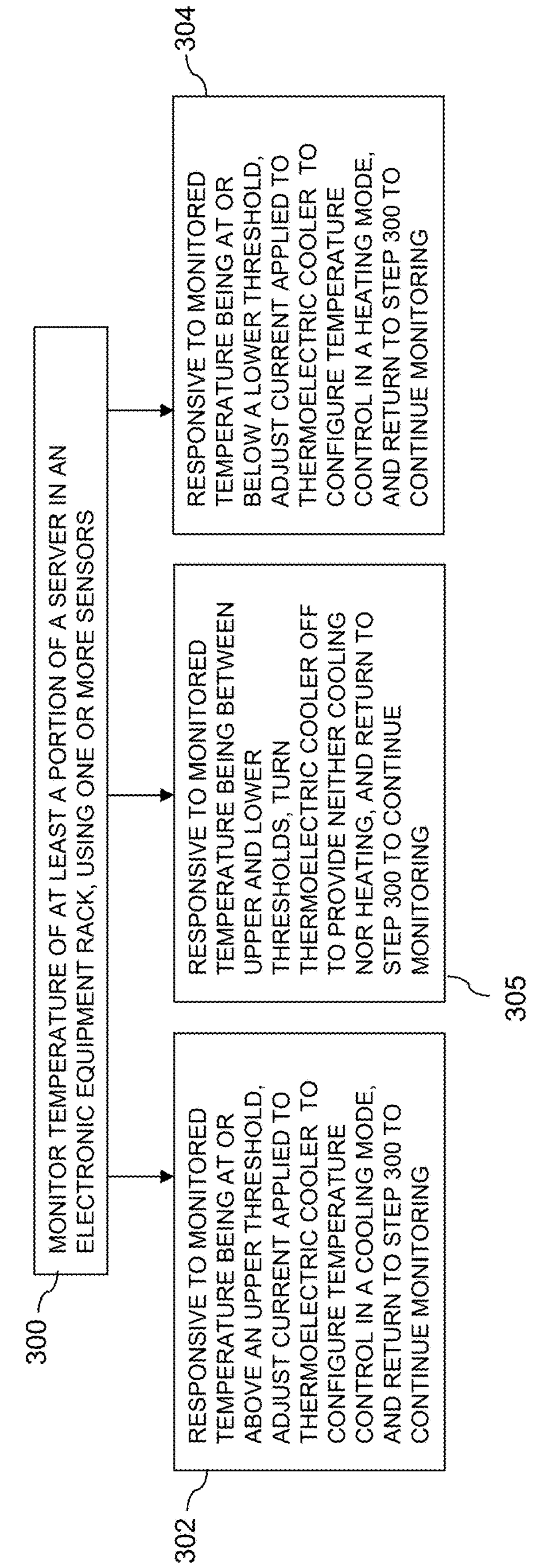
FIG. 3 is a flow diagram of an example process for liquid-assisted and thermoelectric-based temperature control in an illustrative embodiment.

FIG. 3 shows an example process for liquid-assisted and thermoelectric-based temperature control in an illustrative embodiment. The process illustratively includes steps 300 through 305 as shown, and provides a temperature control algorithm that is illustratively implemented at least in part in control circuitry that may be part of at least one of a TEC module and an RHXM. The control circuitry in some embodiments can be implemented at least in part externally to at least one of the TEC module and the RHXM. The control circuitry illustratively comprises at least a portion of a processing device that includes at least one processing device and memory coupled to the processing device. Such control circuitry interacts with one or more temperature sensors deployed within and/or in proximity to a server or other electronic equipment implemented in an electronic equipment chassis. In some embodiments, ambient temperature is monitored, but this is only an example and not limiting in any way. Additional or alternative temperature monitoring arrangements can be used.

In step 300, a temperature of at least a portion of a server in an electronic equipment rack is monitored, using one or more sensors. As indicated above, such monitoring is illustratively performed using one or more temperature sensors deployed within and/or in proximity to the server. In other embodiments, other types of electronic equipment implemented in an electronic equipment chassis, which may or may not be installed in an electronic equipment rack, can be used in place of or in addition to the server. Also, a wide variety of different temperature monitoring arrangements can be used. In some embodiments, an ambient temperature is monitored, and such an ambient temperature is illustratively indicative of the temperature of an environment in which the server or other electronic equipment is deployed. For example, in cases in which the server is deployed as edge computing equipment, the ambient temperature illustratively indicates an external temperature of the server, in the edge computing environment in which the server is deployed. As indicated previously, such deployments can result in significant ambient temperature swings for the server. Additionally or alternatively, the monitored temperature in some embodiments can be determined at least in part as an average or other function of multiple distinct temperatures received from respective ones of a plurality of temperature sensors.

In step 302, responsive to the monitored temperature being at or above an upper threshold, the current applied to a thermoelectric cooler such as TEC 110 or TEC 210 is adjusted so as to configure the temperature control in a cooling mode, for example, as previously described in conjunction with FIG. 2A. This illustratively involves configuring the thermoelectric cooler in a first configuration in which a particular one of the sides is the cold side and the other one of the sides is the hot side. The process then returns to step 300 to continue monitoring the temperature to determine if a subsequent adjustment to the mode of operation is needed.

In step 304, responsive to the monitored temperature being at or below a lower threshold, the current applied to a thermoelectric cooler such as TEC 110 or TEC 210 is adjusted so as to configure the temperature control in a heating mode, for example, as previously described in conjunction with FIG. 2B. This illustratively involves configuring the thermoelectric cooler in a second configuration in which the particular sides of the thermoelectric cooler that are the respective cold and hot sides are reversed relative to the first configuration utilized for the cooling mode in step 302. The process then returns to step 300 to continue monitoring the temperature to determine if a subsequent adjustment to the mode of operation is needed.

In step 305, responsive to the monitored temperature being between the upper and lower thresholds, the thermoelectric cooler such as TEC 110 or TEC 210 is turned off, so as to provide neither cooling nor heating. For example, the current applied to the thermoelectric cooler is illustratively terminated or otherwise interrupted, such that neither side of the thermoelectric cooler is a cold side or a hot side. This may be considered a normal mode of operation. The process then returns to step 300 to continue monitoring the temperature to determine if a subsequent adjustment to the mode of operation is needed.

The particular processing operations and other system functionality described in conjunction with the flow diagram of FIG. 3 are presented by way of illustrative example only, and should not be construed as limiting the scope of the disclosure in any way. Alternative embodiments can use other types of processing operations involving electronic equipment, thermoelectric coolers, heat exchanger modules, liquid-carrying conduits and additional or alternative components, as well as additional or alternative functionality for implementing the disclosed liquid-assisted and thermoelectric-based temperature control for a server or other type of electronic equipment. Also, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different arrangements for temperature control for different instances of electronic equipment, such as different servers or other electronic equipment installed at different positions in an electronic equipment rack.

Functionality such as that described in conjunction with the flow diagram of FIG. 3 can be implemented at least in part in the form of one or more software programs stored in memory and executed by a processor of a processing device, that may be arranged internal or external to the server or other electronic equipment, illustratively within or in proximity to a corresponding electronic equipment chassis. A memory or other storage device having executable program code of one or more software programs embodied therein is an example of what is more generally referred to herein as a "processor-readable storage medium."

The processor may comprise a microprocessor, a microcontroller, an application-specific integrated circuit (ASIC), a field-programmable gate array (FPGA), a System-on-Chip (SOC) and/or other types of processing circuitry, as well as portions or combinations of such circuitry elements.

The memory may comprise random access memory (RAM), read-only memory (ROM), flash memory or other types of memory, in any combination. The memory and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals.

Figure 4:
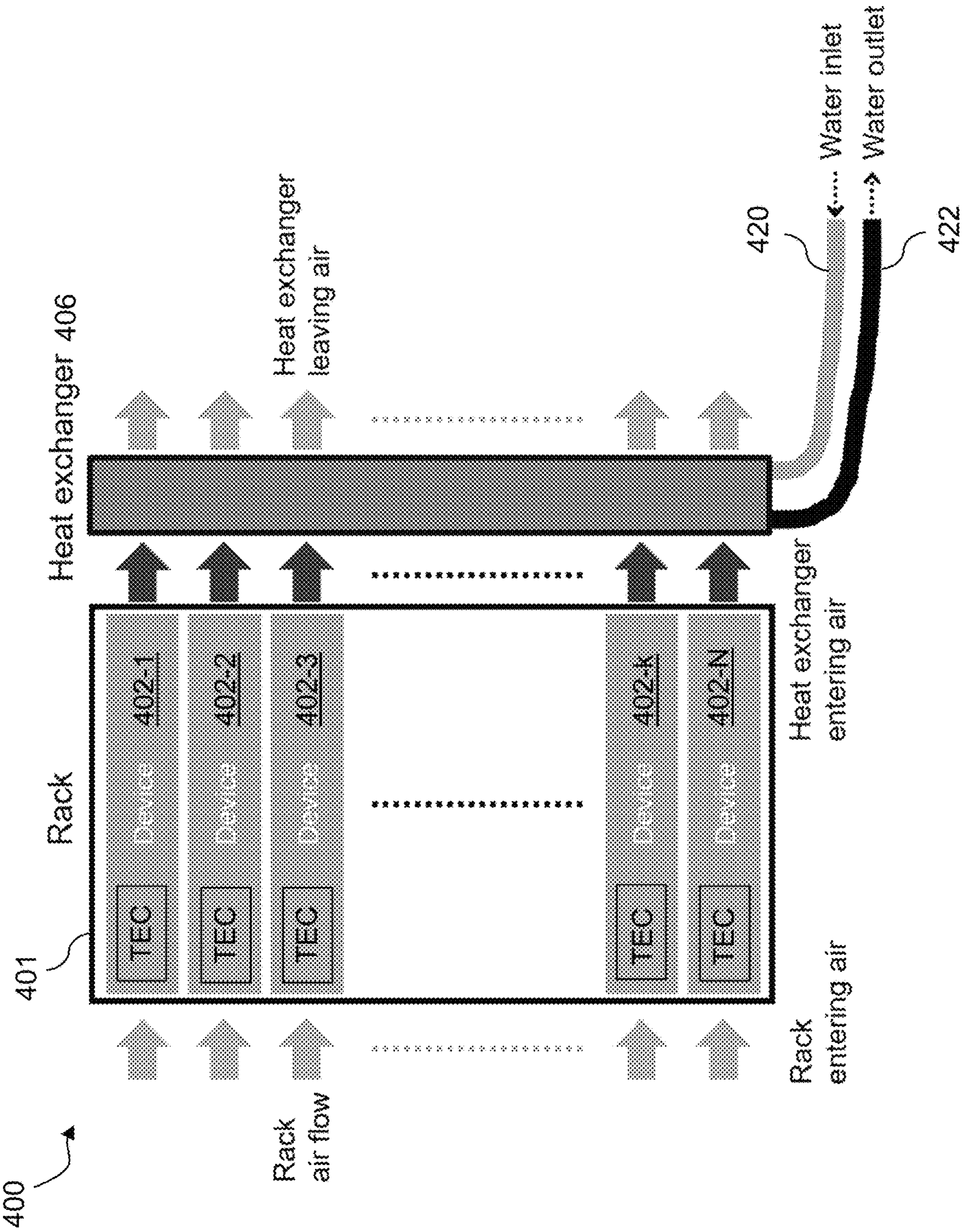
FIG. 4 is a side view of an example rack arrangement comprising multiple servers or other devices for which liquid-assisted and thermoelectric-based temperature control is provided in an illustrative embodiment.

Referring now to FIG. 4, an example rack arrangement 400 is shown. The rack arrangement 400 comprises an electronic equipment rack 401 in which multiple servers or other devices 402-1, 402-2, 402-3, . . . 402-*k*, . . . 402-N are installed as shown. In this embodiment, liquid-assisted and thermoelectric-based temperature control is provided for each of the devices 402 in the electronic equipment rack 401 in the manner disclosed herein. The rack arrangement 400 further comprises a heat exchanger 406 arranged adjacent a rear portion of the electronic equipment rack 401 and respective rear portions of its corresponding devices 402. It should be noted that other types of electronic equipment racks can be used in other embodiments, and the term "electronic equipment rack" as used herein is intended to be broadly construed so as to encompass such other arrangements, including by way of example various types of electronic equipment cabinets.

The air flow in this embodiment is from a front portion of the electronic equipment rack 401 towards the rear portion of the electronic equipment rack 401 adjacent the heat exchanger 406, as indicated by the arrows corresponding to rack entering air, heat exchanger entering air and heat exchanger leaving air. The heat exchanger also includes a water inlet 420 and a water outlet 422, which are assumed to be coupled to a pump that is not explicitly shown. The heat exchanger 406 and its associated pump are illustratively part of an RHXM that is implemented as a combined unit supporting RHXM functionality for all of the devices 402. Alternatively, such an RHXM may be implemented as multiple separate and distinct units for respective ones of the devices 402.

Each of the devices 402 illustratively comprises one or more TEC modules of the type disclosed herein, such as TEC module 104 or TEC module 204, arranged adjacent to a front portion of the corresponding device as shown in the figure. It is assumed in this embodiment that such TEC modules are integrated into respective front portions of the corresponding electronic equipment chassis of the respective devices 402, although numerous other arrangements of the TEC modules are possible.

Accordingly, separate instances of the TEC modules are illustratively arranged adjacent respective front portions of respective ones of the electronic equipment chassis of the devices 402 installed in the electronic equipment rack 401. Each such TEC module illustratively comprises a thermoelectric cooler, a cold plate coupled to a first side of the thermoelectric cooler, and a heatsink coupled to a second side of the thermoelectric cooler opposite the first side. The TEC modules interact with one or more heat exchanger modules arranged adjacent a rear portion of their respective electronic equipment chassis, and such modules are illustratively part of or otherwise associated with heat exchanger 406.

At least first and second liquid-carrying conduits are coupled between given one of the TEC modules and a given one of the heat exchanger modules and pass through at least a portion of the corresponding electronic equipment chassis. The given TEC module, the given heat exchanger module and the associated liquid-carrying conduits are collectively configured to provide temperature control for one or more components of the electronic equipment installed in the given electronic equipment chassis of the corresponding one of the devices 402, in the manner described elsewhere herein.

Illustrative embodiments provide a number of significant advantages relative to conventional approaches.

For example, some embodiments leverage both cooling and heating abilities of the TEC in a manner that does not significantly increase the footprint, chassis height or other aspects of the footprint of the server or other electronic equipment. As a result, some embodiments can be implemented utilizing only a single air channel, rather than requiring a more space-consuming arrangement with multiple air channels.

Moreover, some embodiments implement liquid-assisted cooling to cool the TCE module via an RHXM and liquid-carrying pipes arranged between the cold plate of the TCE module and the RHXM. In some embodiments, a pump is integrated in the RHXM to sustain the inner loop water flow without the need for any external coolant distribution units (CDUs).

In some embodiments, the TEC module and the RHXM can be attached to and detached from the server or other electronic equipment, as needed depending on usage, via respective quick-disconnect interfaces, thereby providing a highly-flexible temperature control arrangement.

Illustrative embodiments utilize the TEC module to generate cool air or warm air in respective cooling and heating modes, depending on the ambient temperature and/or other monitored temperature, through current direction control applied to the TEC module. This provides a distinct advantage over conventional arrangements that only utilize the cooling capability of the TEC module, while the heating capability of the TEC module is wasted. For example, such conventional arrangements typically adhere or otherwise couple the cool side of the TEC module to high-power consumption components such as CPUs and/or GPUs, while other components do not obtain any significant benefit from the TEC module.

It is to be appreciated that the particular advantages described above and elsewhere herein are associated with particular illustrative embodiments and need not be present in other embodiments. Also, the particular types of features and functionality as illustrated in the drawings and described above are exemplary only, and numerous other arrangements may be used in other embodiments.

It should again be emphasized that the above-described embodiments are presented for purposes of illustration only. Many variations and other alternative embodiments may be used. For example, the disclosed techniques are applicable to a wide variety of other types of electronic equipment, electronic equipment chassis and rack configurations, thermoelectric modules, heat exchanger modules, temperature control processes, and additional or alternative components and techniques. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:

an electronic equipment chassis having electronic equipment installed therein;

a thermoelectric module arranged adjacent a front portion of the electronic equipment chassis;

a heat exchanger module arranged adjacent a rear portion of the electronic equipment chassis; and at least first and second liquid-carrying conduits coupled between the thermoelectric module and the heat exchanger module and passing through at least a portion of the electronic equipment chassis;

wherein each of the liquid-carrying conduits is connected at a first end thereof to a cold plate of the thermoelectric module and at a second end thereof to the heat exchanger module; and wherein the thermoelectric module, the heat exchanger module and the liquid-carrying conduits are collectively configured to provide temperature control for one or more components of the electronic equipment.

2. The apparatus of claim 1 wherein the electronic equipment installed in the electronic equipment chassis comprises at least one server.

3. The apparatus of claim 1 wherein the thermoelectric module is at least one of coupled to an exterior surface of the front portion of the electronic equipment chassis and coupled to a front portion of an electronic equipment rack in which the electronic equipment chassis is installed.

4. The apparatus of claim 1 wherein the thermoelectric module comprises:

a thermoelectric cooler;

the cold plate, coupled to a first side of the thermoelectric cooler; and a heatsink coupled to a second side of the thermoelectric cooler opposite the first side.

5. The apparatus of claim 1 wherein the heat exchanger module is at least one of coupled to an exterior surface of the rear portion of the electronic equipment chassis and coupled to a rear portion of an electronic equipment rack in which the electronic equipment chassis is installed.

6. The apparatus of claim 1 wherein the heat exchanger module comprises a heat exchanger and a pump, the pump being configured to circulate liquid through the thermoelectric module, the heat exchanger and the liquid-carrying conduits.

7. The apparatus of claim 1 wherein in a cooling mode of operation, a control current is applied to a thermoelectric cooler of the thermoelectric module to configure a first side of the thermoelectric cooler adjacent the cold plate of the thermoelectric module as a hot side of the thermoelectric cooler, and to configure a second side of the thermoelectric cooler adjacent a heatsink of the thermoelectric module as a cold side of the thermoelectric cooler, with the heat exchanger module moving hot water from the hot side of the thermoelectric cooler via the cold plate and the first liquid-carrying conduit into the heat exchanger module, and moving cool water from the heat exchanger module back to the hot side of the thermoelectric cooler via the second liquid-carrying conduit and the cold plate, and with cool air generated from the cold side of the thermoelectric cooler being pulled from the front portion of the electronic equipment chassis to the rear portion of the electronic equipment chassis to cool the one or more components of the electronic equipment.

8. The apparatus of claim 1 wherein in a heating mode of operation, a control current is applied to a thermoelectric cooler of the thermoelectric module to configure a first side of the thermoelectric cooler adjacent the cold plate of the thermoelectric module as a cold side of the thermoelectric cooler, and to configure a second side of the thermoelectric cooler adjacent a heatsink of the thermoelectric module as a hot side of the thermoelectric cooler, with the heat exchanger module moving cool water from the cold side of the thermoelectric cooler via the cold plate and the first liquid-carrying conduit into the heat exchanger module, and moving hot water from the heat exchanger module back to the cold side of the thermoelectric cooler via the second liquid-carrying conduit and the cold plate, and with warm air generated from the hot side of the thermoelectric cooler being pulled from the front portion of the electronic equipment chassis to the rear portion of the electronic equipment chassis to heat the one or more components of the electronic equipment.

9. The apparatus of claim 1 wherein in an additional mode of operation, an amount of control current applied to a thermoelectric cooler of the thermoelectric module is adjusted such that neither a first side of the thermoelectric cooler adjacent the cold plate nor a second side of the thermoelectric cooler adjacent a heatsink is configured as a cold side or a hot side, and neither cooling nor heating is provided.

10. A method comprising:

providing an electronic equipment chassis having electronic equipment installed therein;

deploying a thermoelectric module arranged adjacent a front portion of the electronic equipment chassis, a heat exchanger module arranged adjacent a rear portion of the electronic equipment chassis, and at least first and second liquid-carrying conduits coupled between the thermoelectric module and the heat exchanger module and passing through at least a portion of the electronic equipment chassis, wherein each of the liquid-carrying conduits is connected at a first end thereof to a cold plate of the thermoelectric module and at a second end thereof to the heat exchanger module; and providing temperature control for one or more components of the electronic equipment utilizing the thermoelectric module, the heat exchanger module and the liquid-carrying conduits.

11. The method of claim 10 wherein providing temperature control further comprises, in a cooling mode of operation, applying a control current to a thermoelectric cooler of the thermoelectric module to configure a first side of the thermoelectric cooler adjacent the cold plate of the thermoelectric module as a hot side of the thermoelectric cooler, and to configure a second side of the thermoelectric cooler adjacent a heatsink of the thermoelectric module as a cold side of the thermoelectric cooler, with the heat exchanger module moving hot water from the hot side of the thermoelectric cooler via the cold plate and the first liquid-carrying conduit into the heat exchanger module, and moving cool water from the heat exchanger module back to the hot side of the thermoelectric cooler via the second liquid-carrying conduit and the cold plate, and with cool air generated from the cold side of the thermoelectric cooler being pulled from the front portion of the electronic equipment chassis to the rear portion of the electronic equipment chassis to cool the one or more components of the electronic equipment.

12. The method of claim 10 wherein providing temperature control further comprises, in a heating mode of operation, applying a control current to a thermoelectric cooler of the thermoelectric module to configure a first side of the thermoelectric cooler adjacent the cold plate of the thermoelectric module as a cold side of the thermoelectric cooler, and to configure a second side of the thermoelectric cooler adjacent a heatsink of the thermoelectric module as a hot side of the thermoelectric cooler, with the heat exchanger module moving cool water from the cold side of the thermoelectric cooler via the cold plate and the first liquid-carrying conduit into the heat exchanger module, and moving hot water from the heat exchanger module back to the cold side of the thermoelectric cooler via the second liquid-carrying conduit and the cold plate, and with warm air generated from the hot side of the thermoelectric cooler being pulled from the front portion of the electronic equipment chassis to the rear portion of the electronic equipment chassis to heat the one or more components of the electronic equipment.

13. The method of claim 10 wherein providing temperature control further comprises, in an additional mode of operation, adjusting an amount of control current applied to a thermoelectric cooler of the thermoelectric module such that neither a first side of the thermoelectric cooler adjacent the cold plate nor a second side of the thermoelectric cooler adjacent a heatsink is configured as a cold side or a hot side, and neither cooling nor heating is provided.

14. An apparatus comprising:

an electronic equipment rack;

a plurality of electronic equipment chassis installed in the electronic equipment rack, each electronic equipment chassis having electronic equipment installed therein;

a thermoelectric module arranged adjacent a front portion of at least a given one of the electronic equipment chassis;

a heat exchanger module arranged adjacent a rear portion of the given electronic equipment chassis; and at least first and second liquid-carrying conduits coupled between the thermoelectric module and the heat exchanger module and passing through at least a portion of the given electronic equipment chassis;

wherein each of the liquid-carrying conduits is connected at a first end thereof to a cold plate of the thermoelectric module and at a second end thereof to the heat exchanger module; and wherein the thermoelectric module, the heat exchanger module and the liquid-carrying conduits are collectively configured to provide temperature control for one or more components of the electronic equipment installed in the given electronic equipment chassis.

15. The apparatus of claim 14 wherein separate instances of the thermoelectric module are arranged adjacent respective front portions of respective ones of the electronic equipment chassis installed in the electronic equipment rack.

16. The apparatus of claim 14 wherein the thermoelectric module comprises:

a thermoelectric cooler;

the cold plate, coupled to a first side of the thermoelectric cooler; and a heatsink coupled to a second side of the thermoelectric cooler opposite the first side.

17. The apparatus of claim 14 wherein separate instances of the heat exchanger module are arranged adjacent respective rear portions of respective ones of the electronic equipment chassis installed in the electronic equipment rack.

18. The apparatus of claim 14 wherein a single instance of the heat exchanger module is arranged adjacent respective rear portions of respective ones of the electronic equipment chassis installed in the electronic equipment rack.

19. The apparatus of claim 14 wherein the heat exchanger module comprises a heat exchanger and a pump, the pump being configured to circulate liquid through the thermoelectric module, the heat exchanger and the liquid-carrying conduits.

20. The apparatus of claim 14 wherein in a cooling mode of operation, a control current is applied to a thermoelectric cooler of the thermoelectric module to configure a first side of the thermoelectric cooler adjacent the cold plate of the thermoelectric module as a hot side of the thermoelectric cooler, and to configure a second side of the thermoelectric cooler adjacent a heatsink of the thermoelectric module as a cold side of the thermoelectric cooler, with the heat exchanger module moving hot water from the hot side of the thermoelectric cooler via the cold plate and the first liquid-carrying conduit into the heat exchanger module, and moving cool water from the heat exchanger module back to the hot side of the thermoelectric cooler via the second liquid-carrying conduit and the cold plate, and with cool air generated from the cold side of the thermoelectric cooler being pulled from the front portion of the electronic equipment chassis to the rear portion of the electronic equipment chassis to cool the one or more components of the electronic equipment.

* * * * *